US010096369B2

(12) United States Patent
Murakami et al.

(10) Patent No.: US 10,096,369 B2
(45) Date of Patent: Oct. 9, 2018

(54) SEMICONDUCTOR DEVICE INCLUDING A VOLTAGE GENERATION CIRCUIT, AND VOLTAGE GENERATION CIRCUIT GENERATES A REQUIRED VOLTAGE ACCORDING TO INTERNAL DATA REQUESTED IN RESPONSE TO AN OPERATION

(71) Applicant: Winbond Electronics Corp., Taichung (TW)

(72) Inventors: Hiroki Murakami, Kanagawa (JP); Makoto Senoo, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 14 days.

(21) Appl. No.: 15/611,791

(22) Filed: Jun. 2, 2017

(65) Prior Publication Data
US 2017/0365351 A1 Dec. 21, 2017

(30) Foreign Application Priority Data

Jun. 15, 2016 (JP) ................................. 2016-118862

(51) Int. Cl.
*G11C 16/14* (2006.01)
*G11C 16/26* (2006.01)
(Continued)

(52) U.S. Cl.
CPC .............. *G11C 16/32* (2013.01); *G11C 5/066* (2013.01); *G11C 7/1066* (2013.01); *G11C 16/08* (2013.01);
(Continued)

(58) Field of Classification Search
CPC ..................................................... G11C 16/32
See application file for complete search history.

(56) References Cited

U.S. PATENT DOCUMENTS 5,881,121 A * 3/1999 Mann ................. G11C 16/10
377/26
5,883,501 A * 3/1999 Arakawa ............. G05F 3/247
323/222
(Continued)

FOREIGN PATENT DOCUMENTS

JP 2003141888 5/2003
JP 2010130781 6/2010
(Continued)

OTHER PUBLICATIONS

Encyclopedia.com (http://www.encyclopedia.com/computing/dictionaries-thesauruses-pictures-and-press-releases/data-bus, originally published by Oxford University Press 2004, information accessed Jan. 3, 2018).*

*Primary Examiner* — Anthan Tran
*Assistant Examiner* — Mushfique Siddique
(74) *Attorney, Agent, or Firm* — JCIPRNET

(57) ABSTRACT

A semiconductor device including a voltage generation circuit, and voltage generation circuit generates a required voltage according to internal data requested in response to an operation are provided. The voltage generating circuit includes a plurality of registers A-1, B-1, C-1, D-1, voltage generating blocks A-2, B-2, C-2 and a voltage switch. The registers A-1, B-1, C-1, D-1 hold data provided from control logic. The voltage generating blocks A-2, B-2, C-2 generate voltage based on voltage control data held by the registers A-1, B-1, C-1. The voltage switch selects voltages based on selection control data held by the register D-1. The connecting element includes signal lines for sequentially transmitting the voltage control data or the selection control data, signal lines for sequentially transmitting a clock signal CLK and signal lines for controlling output of data held by the registers.

13 Claims, 13 Drawing Sheets

(51) Int. Cl.
  *G11C 16/32* (2006.01)
  *G11C 5/06* (2006.01)
  *G11C 7/10* (2006.01)
  *G11C 16/08* (2006.01)
  *G11C 16/10* (2006.01)
  *G11C 16/30* (2006.01)

(52) U.S. Cl.
  CPC ............ *G11C 16/10* (2013.01); *G11C 16/14* (2013.01); *G11C 16/26* (2013.01); *G11C 16/30* (2013.01); *G11C 2207/108* (2013.01)

(56) References Cited

U.S. PATENT DOCUMENTS

| | | | | | |
|---|---|---|---|---|---|
| 6,052,314 | A * | 4/2000 | Sawase | ................ | G11C 7/1045 365/185.02 |
| 6,278,633 | B1 * | 8/2001 | Wong | .................. | G11C 7/1039 365/185.03 |
| 6,343,041 | B1 * | 1/2002 | Kanazashi | ........... | G11C 7/1006 365/189.12 |
| 6,351,139 | B1 * | 2/2002 | Ighani | .................. | G11C 7/1006 326/38 |
| 6,370,075 | B1 * | 4/2002 | Haeberli | ................ | G11C 5/145 327/536 |
| 6,763,079 | B1 * | 7/2004 | Iwamoto | .......... | G01R 31/31725 327/156 |
| 7,368,939 | B2 * | 5/2008 | Ito | ........................ | G11C 7/1036 326/38 |
| 7,397,717 | B2 * | 7/2008 | Chen | .................... | G11C 7/1075 365/185.33 |
| 7,491,602 | B2 * | 2/2009 | Agarwal | ................. | H01L 28/40 257/306 |
| 7,529,138 | B2 * | 5/2009 | Park | ....................... | G11C 16/16 365/185.17 |
| 8,122,302 | B2 * | 2/2012 | Chung | ................. | G11C 7/1006 455/522 |
| 8,619,473 | B2 * | 12/2013 | Kim | ........................ | G11C 5/14 365/185.18 |
| 8,917,554 | B2 * | 12/2014 | Toyama | ................. | G11C 16/08 365/185.11 |
| 2002/0024330 | A1 * | 2/2002 | Hosogane | ................ | G06F 1/22 323/317 |
| 2003/0084231 | A1 * | 5/2003 | Yoshimura | ............ | G06F 3/0607 711/103 |
| 2003/0135690 | A1 * | 7/2003 | Lee | ...................... | G11C 7/1078 711/103 |
| 2004/0061139 | A1 * | 4/2004 | Natori | .................... | G11C 16/30 257/200 |
| 2006/0044874 | A1 * | 3/2006 | Tokiwa | .............. | G11C 16/0483 365/185.21 |
| 2006/0048027 | A1 * | 3/2006 | Takai | ....................... | G11C 7/20 714/724 |
| 2006/0215477 | A1 * | 9/2006 | Yano | ................... | G11C 16/0466 365/230.03 |
| 2006/0226871 | A1 * | 10/2006 | Ito | ........................ | G11C 7/1036 326/38 |
| 2006/0239108 | A1 * | 10/2006 | Shimizu | ................ | G11C 16/08 365/230.06 |
| 2006/0268642 | A1 * | 11/2006 | Chen | ...................... | G11C 5/066 365/220 |
| 2008/0055991 | A1 * | 3/2008 | Kim | ................... | G11C 16/0483 365/185.11 |
| 2008/0094898 | A1 * | 4/2008 | Nakano | ................ | G11C 7/1006 365/185.09 |
| 2008/0136501 | A1 * | 6/2008 | Suzuki | ................... | G11C 5/143 327/536 |
| 2009/0085676 | A1 * | 4/2009 | Nishiyama | ........... | H03K 3/0315 331/18 |
| 2010/0127761 | A1 * | 5/2010 | Matano | .................... | H02M 3/07 327/536 |
| 2010/0172181 | A1 * | 7/2010 | Murakami | ............. | G11C 16/04 365/185.12 |
| 2010/0214862 | A1 * | 8/2010 | Kim | ....................... | G11C 5/147 365/226 |
| 2012/0155179 | A1 * | 6/2012 | Komine | ............. | G11C 16/0483 365/185.17 |
| 2012/0206970 | A1 * | 8/2012 | Watanabe | ............... | G11C 7/222 365/185.18 |
| 2014/0233328 | A1 * | 8/2014 | Ito | ............................. | G11C 7/20 365/189.09 |
| 2014/0351609 | A1 * | 11/2014 | Shiah | .................... | G06F 1/3296 713/300 |
| 2015/0029806 | A1 * | 1/2015 | Qiao | ........................ | H02M 3/07 365/226 |
| 2016/0071610 | A1 * | 3/2016 | Murakami | ............. | G11C 16/32 365/185.18 |
| 2016/0241218 | A1 * | 8/2016 | Muneyasu | ............. | H03K 3/013 |
| 2016/0350253 | A1 * | 12/2016 | Kojima | ................ | G06F 13/4027 |
| 2017/0185297 | A1 * | 6/2017 | Kim | ........................ | G06F 3/061 |
| 2017/0243656 | A1 * | 8/2017 | Murakami | ........... | H05K 999/99 |
| 2017/0365325 | A1 * | 12/2017 | Murakami | ......... | G11C 16/0483 |
| 2017/0365351 | A1 * | 12/2017 | Murakami | ............. | G11C 16/14 |

FOREIGN PATENT DOCUMENTS

| | | |
|---|---|---|
| JP | 2011004452 | 1/2011 |
| TW | 1520136 | 2/2016 |

* cited by examiner

SEMICONDUCTOR DEVICE INCLUDING A VOLTAGE GENERATION CIRCUIT, AND VOLTAGE GENERATION CIRCUIT GENERATES A REQUIRED VOLTAGE ACCORDING TO INTERNAL DATA REQUESTED IN RESPONSE TO AN OPERATION

CROSS-REFERENCE TO RELATED APPLICATION

This application claims the priority benefit of Japan application serial no. 2016-118862, filed on Jun. 15, 2016. The entirety of the above-mentioned patent application is hereby incorporated by reference herein and made a part of this specification.

BACKGROUND OF THE INVENTION

Field of the Invention

The invention relates to a semiconductor device, and particularly relates to a semiconductor device having a following circuit, where the circuit generates an output such as a voltage, etc. required for operation according to an internal control signal.

Description of Related Art

In a NAND flash memory or a NOR flash memory, voltages of various levels are required in a read operation, a program operation and an erase operation of data. Generally, in the flash memory, a charge pump is adopted to boost a voltage supplied from external, and the boosted voltage is used to generate a program voltage or an erase voltage. For example, a patent literature 1 discloses a charge pump circuit of a series connection mode capable of decreasing a charge loss caused by parasitic capacitances.

EXISTING TECHNICAL LITERATURE

Patent Literature

[Patent literature 1] Japan patent publication No. 2010-130781

PROBLEMS TO BE RESOLVED BY THE INVENTION

In the NAND or NOR flash memory, in order to compensate operations with high reliability, a strict and complex voltage condition is required for each of the operations. Therefore, although the flash memories of the recent years are intelligent, there is a very large voltage control logic, and a large amount of voltage control signal lines are configured in a peripheral circuit.

FIG. 1 is a structural block diagram of a conventional voltage generation circuit. The voltage generation circuit 10 includes a control logic 20, a local block 30 and single lines 40 electrically connecting the control logic 20 and the local block 30. The control logic 20 calculates voltages required for operations of a flash memory, and parallelly outputs the calculation results, i.e. voltage control data or selection control data to the local block 30 through the signal lines 40.

The local block 30 includes voltage generating blocks A-2, B-2, C-2, which parallelly input voltage control data A-0, B-0, C-0 coming from the control logic 20, and generate voltages A-3, B-3, C-3 based on the voltage control data A-0, B-0, C-0; and a voltage switch 32, which receives a selection control data SW from the control logic 20, and selects any one of the voltage A-3, the voltage B-3, the voltage C-3 based on the selection control data SW.

The read operation, the program operation and the erase operation of the flash memory have to be executed within the required time. Therefore, it is ideally to broaden a line width of the signal lines 40 to lower a resistance, and when the number of the signal lines 40 is increased, or a width of the wiring layer is enlarged, an occupation space of the signal lines 40 is enlarged, as a result, an occupation space of the peripheral circuit including the voltage generation circuit 10 is increased, which probably obstacles miniaturization of a memory chip.

SUMMARY OF THE INVENTION

In order to resolve the aforementioned problems, the invention is directed to a semiconductor device, which implements space saving of a circuit used for generating voltages of various levels.

Means for Resolving Problems

The invention provides a semiconductor device including: a first circuit, serially outputting at least a clock signal and data; a second circuit, serially inputting the data according to the clock signal output by the first circuit, and including a holding element and a generating element, where the holding element holds the input data, and the generating element generates an output based on data parallelly output by the holding element; and a connecting element, electrically connecting the first circuit and the second circuit, and including a first signal line and a second signal line, where the first signal line transmits the clock signal output by the first circuit, and the second signal line transmits the data output by the first circuit.

The invention provides another semiconductor device including a first circuit, parallelly outputting at least an address signal and data of n bits; a second circuit, including a plurality of holding elements and a generating element, where the generating element generates an output based on data held by the holding elements; and a connecting element, electrically connecting the first circuit and the second circuit, and including a signal line used for transmitting the address signal and n signal lines parallelly transmitting the data of n bits, where the holding elements are respectively selected according to the address signal, and the holding element selected according to the address signal parallelly inputs the data output by the first circuit.

Effect of the Invention

According to the above description, the first circuit serially outputs the clock signal and data to the second circuit, so that compared to the conventional structure, the number of signal lines of the connecting elements used for connecting the first circuit and the second circuit is decreased, and the space occupied by the signal lines is decreased. In a more preferred configuration, the first circuit makes the holding element to hold the secondary data during a period that the second circuit generates the output, so that the second circuit may continuously generate the outputs, so that regarding the operations required in the semiconductor device, the outputs generated by the second circuit can be quickly provided.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The embodiments of the invention are described in detail below with reference of figures. A semiconductor device of the invention preferably includes a circuit, and the circuit generates an output based on internal data requested in response to an executed operation. For example, the semiconductor device includes a voltage generation circuit, and the voltage generation circuit generates a required voltage according to internal data requested in response to a read operation, a program operation, an erase operation of a memory. However, the invention is not limited to the voltage generation circuit, and the invention is adapted to all of circuits capable of generating the outputs required by the operations of the semiconductor device. Moreover, in a preferred configuration, the invention is adapted to a semiconductor storage device such as a NAND or NOR flash memory, a dynamic random access memory (DRAM), etc., and is accordingly adapted to the semiconductor device embedded in the above type of memory device.

[Embodiments]

Figure 1:
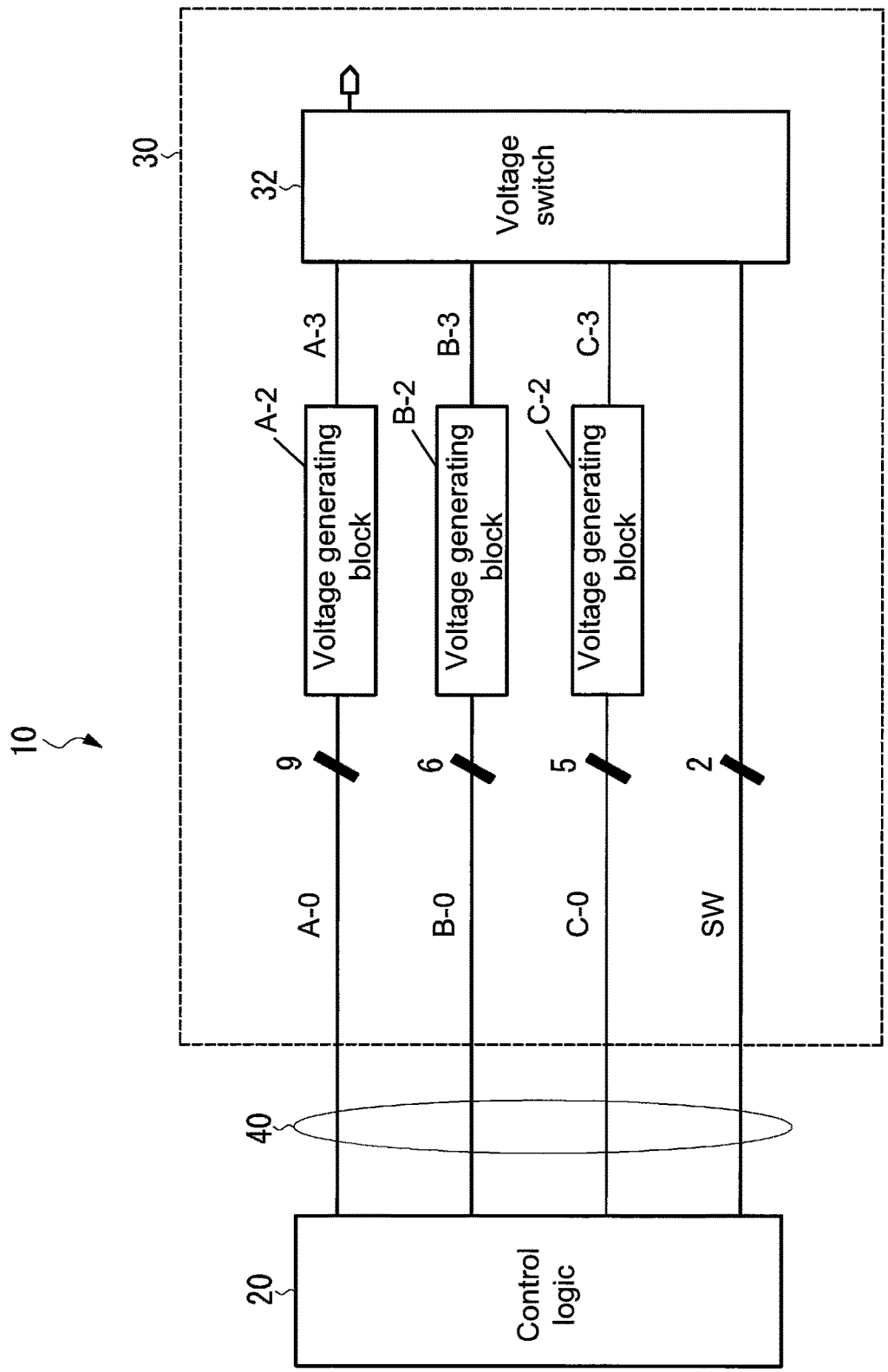
FIG. 1 is a structural block diagram of a conventional voltage generation circuit.
Figure 2:
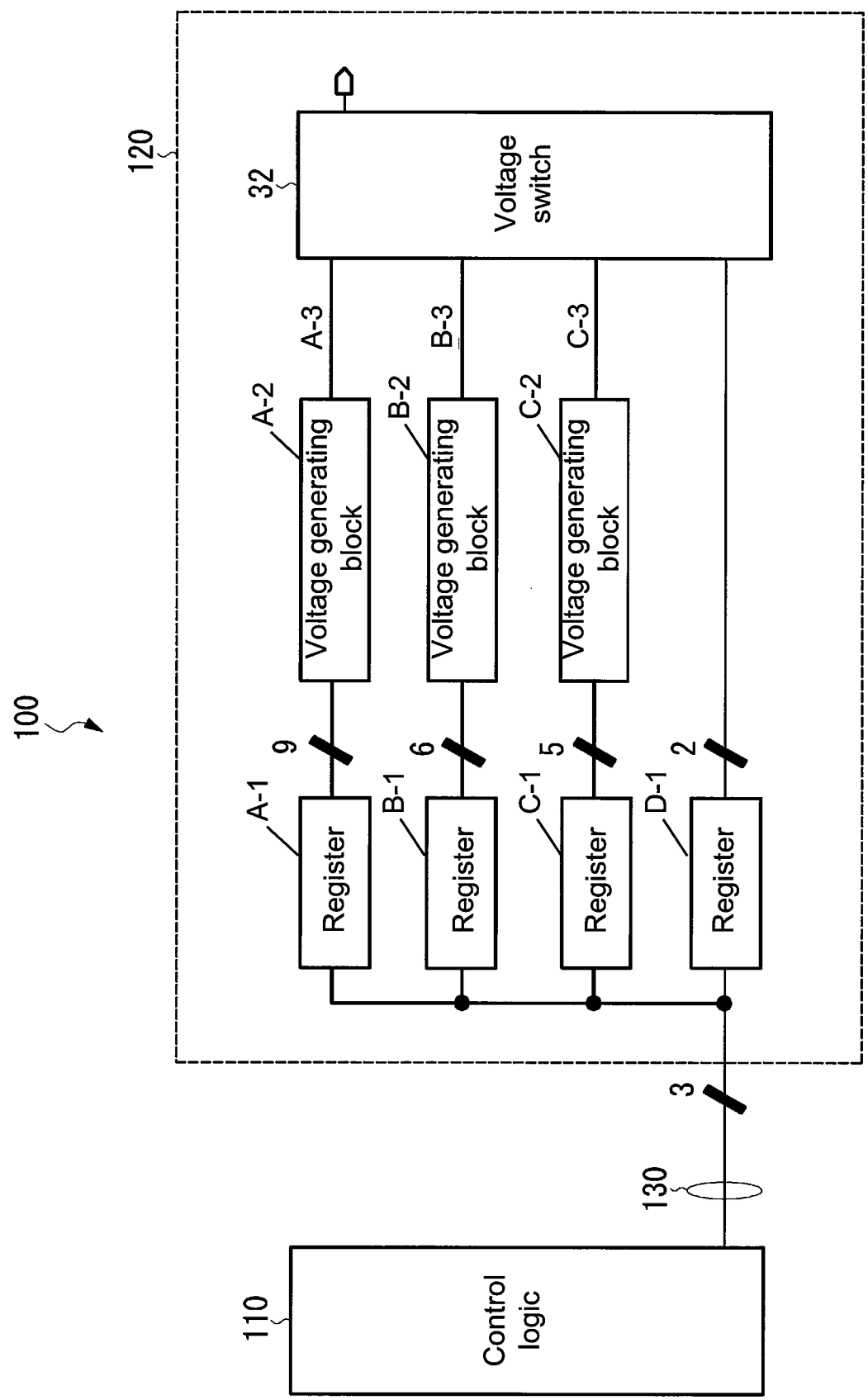
FIG. 2 is a structural block diagram of a voltage generation circuit according to a first embodiment of the invention.

FIG. 2 is a structural block diagram of a voltage generation circuit included in a flash memory according to a first embodiment of the invention. As shown in FIG. 2, the voltage generation circuit 100 includes a control logic 110, a voltage generating element 120 and a connecting element 130 used for electrically connecting the control logic 110 and the voltage generating element 120. The voltage generating element 120 receives voltage control data from the control logic 110, and generates a required voltage according to the voltage control data.

The control logic 110 calculates a voltage required by an operation of the flash memory, and serially outputs a calculation result, i.e. the voltage control data to the voltage generating element 120. The voltage generating element 120 includes a circuit used for generating voltages, for example, a charge pump used for producing a high voltage or a level shift circuit, etc. The voltage generating element 120 generates a read voltage, a program voltage, an erase voltage, etc. according to the voltage control data.

In a preferred configuration, the voltage generation circuit 100 is formed in a peripheral circuit of a storage chip. The control logic 110 is formed in the first semiconductor region of a semiconductor substrate, and the voltage generating element 120 is formed in the second semiconductor region physically isolated from the first semiconductor region. For example, the control logic 110 is composed of a transistor that can be activated by a relatively lower voltage. On the other hand, the voltage generating element 120 is composed of a transistor that can be activated by a relatively higher voltage. The connecting element 130 is a local connection used for electrically connecting the control logic 110 and the voltage generating element 120. In the first embodiment, the connecting element 130 includes 3 signal lines. The signal lines are, for example, a wiring layer including a conductive material such as metal, etc.

The voltage generating element 120 includes: a register A-1, a register B-1 and a register C-1, which hold the voltage control data serially output by the control logic 110; and a register D-1, which holds selection control data serially output by the control logic 110. The register A-1 holds the voltage control data serving as gradation data of 9 bits, the register B-1 holds the voltage control data serving as gradation data of 6 bits, the register C-1 holds the voltage control data serving as gradation data of 5 bits, and the register D-1 holds the selection control data of 2 bits. The registers A-1, B-1, C-1 respectively output the held voltage control data to voltage generating blocks A-2, B-2, C-2 in response to after-mentioned output control data LAT, and the register D-1 outputs the held selection control data to a voltage switch 32.

The voltage generating element 120 further includes the voltage generating block A-2, which generates a voltage A-3 based on the voltage control data of 9 bits; the voltage generating block B-2, which generates a voltage B-3 based on the voltage control data of 6 bits; the voltage generating block C-2, which generates a voltage C-3 based on the voltage control data of 5 bits; and the voltage switch 32, which selects any one of the voltage A-3, the voltage B-3 or the voltage C-3 based on the selection control data of 2 bits, and outputs the selected voltage. The voltage generating blocks A-2, B-2, C-2, for example, include charge pumps or level conversion circuits, etc.

The connecting element 130 has three signal lines as that described above. The first signal line transmits a clock signal CLK serially output by the control logic 110, the second signal line transmits the voltage control data and the selection control data (for convenience, sometimes the voltage control data and/or the selection control data are collectively referred to as serial data SIO) serially output by the control logic 110, and the third signal line transmits the output control data LAT output by the control logic 110. The output control data LAT control output of the serial data SIO held by the registers A-1~D-1 and the selection control data SW.

The clock signal CLK is commonly connected to the registers A-1~D-1, and the serial data SIO is connected to the register A-1. The registers A-1, B-1, C-1 and D-1 operate like a shift register capable of implementing serial/parallel conversion, the serial data SIO and the clock signal CLK are synchronously and serially input to the registers A-1~D-1, and the registers A-1~D-1 hold the serial data SIO of 22 bits. The data of 22 bits held by the registers A-1~D-1 is parallelly output to the voltage generating blocks A-2, B-2, C-2 and the voltage switch 32 from the registers A-1~D-1 in response to the output control data LAT coming from the control logic 110.

Figure 3:
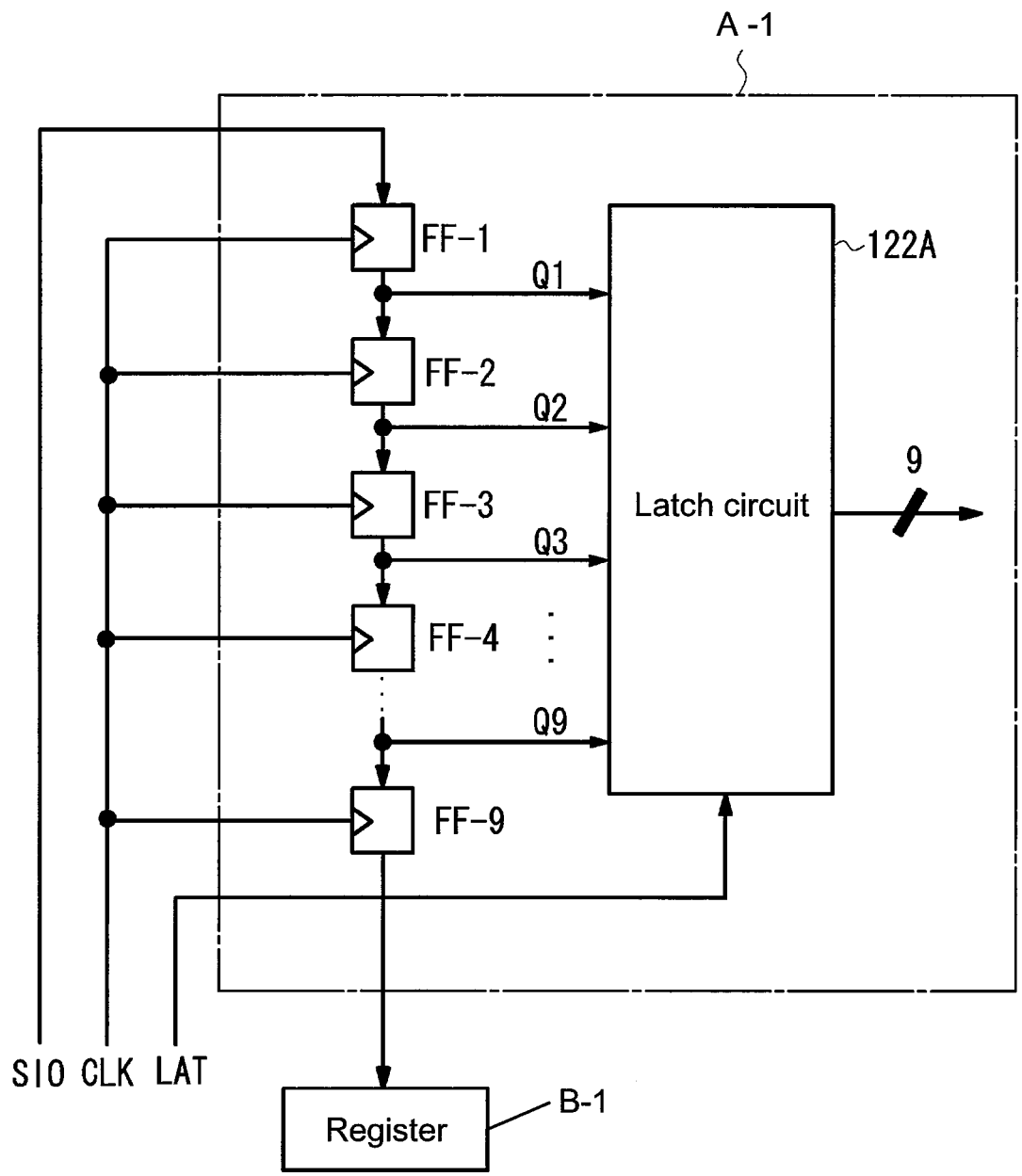
FIG. 3 illustrates an internal structure of a register A-1 of the first embodiment.

FIG. 3 illustrates an internal structure of the register A-1. The register A-1 includes 9 flip-flops FF-1, FF-2, FF-3, FF-4, . . . , FF-9 connected in series and a latch circuit 122A, where the latch circuit 122A holds outputs Q1, Q2, . . . , Q9 of the flip-flops FF-1~FF-9. The latch circuit 122A parallelly outputs the held voltage control data of 9 bits to the voltage generating block A-2 in response to the output control data LAT. The clock signal CLK is commonly supplied to the flip-flops FF-1~FF-9, and the serial data SIO is supplied to data entry of the flip-flop FF-1. The flip-flop FF-1, for example, inputs an initial bit of the serial data SIO in response to a rising edge of the clock signal CLK, and transmits the held one bit to the flip-flop-FF-2 of the next stage in response to a rising edge of the next clock signal CLK, and inputs a next one bit. In this way, when 9 clock signals CLK are input, the serial data SIO of 9 bits is held in the flip-flops FF-1~FF-9. Each time when the clock signal CLK is input, the latch circuit 122A covers and holds the outputs Q1, Q2, . . . , Q9 coming from each of the flip-flops.

Moreover, similar to the register A-1, the registers B-1, C-1, D-1 also include the flip-flops and latch circuits 122B, 122C, 122D (not illustrated). The flip-flop FF-9 of the final stage of the register A-1 is connected to the flip-flop FF-1 of the initial stage of the register B-1, the flip-flop FF-6 of the final stage of the register B-1 is connected to the flip-flop FF-1 of the initial stage of the register C-1, and the flip-flop FF-5 of the final stage of the register C-1 is connected to the flip-flop FF-1 of the initial stage of the register D-1. In this way, when 22 clock signals CLK are input, the serial data SIO of 22 bits are held in the registers A-1~D-1. Moreover, the voltage control data of 9 bits held by the register A-1 is held in the latch circuit 122A, the voltage control data of 6 bits held by the register B-1 is held in the latch circuit 122B, the voltage control data of 5 bits held by the register C-1 is held in the latch circuit 122C, and the selection control data of 2 bits held by the register D-1 is held in the latch circuit 122D.

The latch circuits 122A-122D parallelly output data of 22 bits when the output control data LAT is enabled. In this way, the registers A-1~D-1 serve as a shift register capable of implementing serial/parallel conversion.

Figure 4:
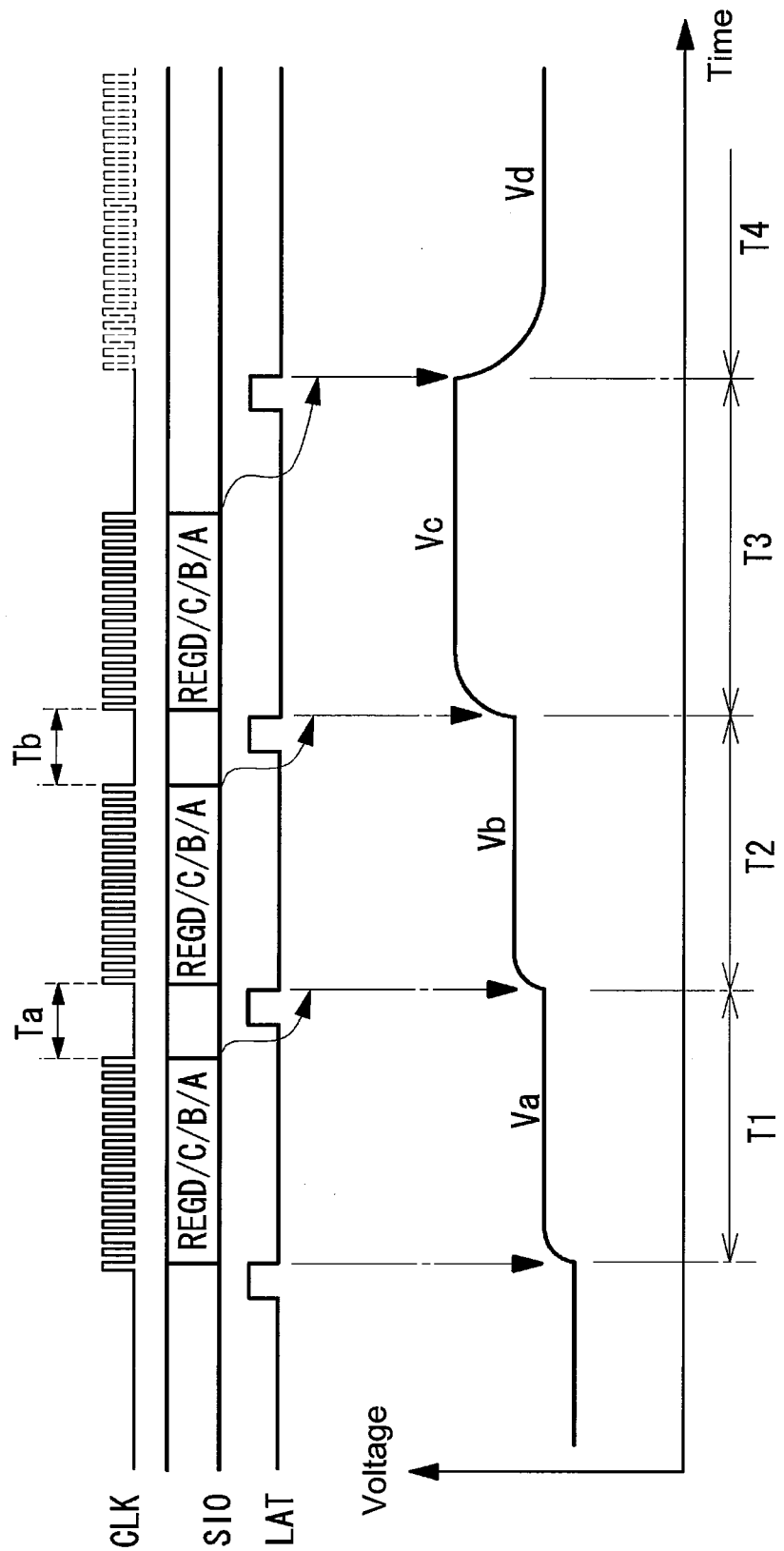
FIG. 4 is a timing diagram for operations of the voltage generation circuit of the first embodiment of the invention.

Then, referring to a timing diagram of FIG. 4 to describe an operation of the voltage generation circuit 100 of the present embodiment. An example of a read operation of the flash memory is provided. When the read operation is started, the registers A-1~D-1 respectively hold initial values, and the initial values of the registers A-1~C-1 are output to the voltage generating blocks A-2~C-2, and the selection of the voltage switch 32 is controlled by the initial value of the register D-1. As a result, a voltage Va is output during a time period T1, and during the time period T1, a first read operation based on the voltage Va is executed.

After the first read operation is started, the control logic 110 calculates a voltage required by a second read operation, and outputs the serial data SIO of 22 bits to the voltage generating element 120 according to the calculation result. The serial data SIO is stepped through the 22 clock signals CLK to update the values of the registers A-1~D-1. The control logic 110 waits for start of the second read operation, and when the first read operation is ended, the output control data LAT is set to be enabled during a period Ta. The latch circuits 122A-122D parallelly output the held data of 22 bits to the voltage generating blocks A-2~C-2 and the voltage switch 32 in response to a situation that the output control data LAT is changed to a H level.

After the first read operation is ended, the second read operation is started during a time period T2. The second read operation uses a voltage Vb output from the voltage switch 32. During the time period T2, the control logic 110 calculates a voltage required by a third read operation, and outputs the serial data SIO of 22 bits to the voltage generating element 120 according to the calculation result. The serial data SIO is stepped through the 22 clock signals CLK to update the values of the registers A-1~D-1. The control logic 110 waits for start of the third read operation, and when the second read operation is ended, the output control data LAT is set to be enabled during a period Tb. The latch circuits 122A-122D parallelly output the held data of 22 bits to the voltage generating blocks A-2~C2 and the voltage switch 32 in response to the situation that the output control data LAT is changed to a H level. After the second read operation is ended, the third read operation is started during a period T3. The third read operation uses a voltage Vc output from the voltage switch 32.

Similarly, the control logic 110 updates the registers A-1~D-1 through the serial data SIO used for a fourth read operation until the third read operation is ended, and during the time period T4, the fourth read operation based on the voltage Vd is executed. In this way, the control logic 110 may easily implement a flexible voltage setting through the serial data SIO and the registers, and set the next serial data SIO in advance in the registers A-1~D-1, such that the time required for generating and outputting voltages is reduced.

In a preferred configuration, when the read operation is ended, the control logic 110 sets initial values of the read operation to the registers A-1~D-1. In this way, when a next read operation is performed, the control logic 110 may transmit the initial values of the read operation, so as to save a period for setting the values of the registers A-1~D-1. Particularly, in case of the read operation, it is required to operate in the shortest time in specification, so that it is preferably to set the initial values in advance when the read operation is ended. However, to set the initial values to the registers A-1~D-1 is not limited to the read operation, and an initial value of an operation with the highest operation frequency in the semiconductor device can also be set. Moreover, the read operation is described above, though generation of the program voltage or the erase voltage of the program operation or the erase operation can also be implemented. Under such situation, when the program operation is ended, an initial value used for the program operation can be set to the registers A-1~D-1, or when the erase operation is ended, an initial value used for the erase operation can be set to the registers A-1~D-1.

In the first embodiment, the control logic 110 steps the serial data SIO, so that during the period of outputting the serial data SIO, the clock signal CLK is synchronously output, though in case that other circuit shares the clock signal CLK, it is unexpected to turn on/off the clock signal CLK. Therefore, in a second embodiment, the control logic 110 outputs a clock enable signal CLKE only during a serial input period of the serial data SIO, such that the clock signal CLK in the registers A-1~D-1 becomes effective, and continuous output of the clock signal CLK becomes possible.

Figure 5:
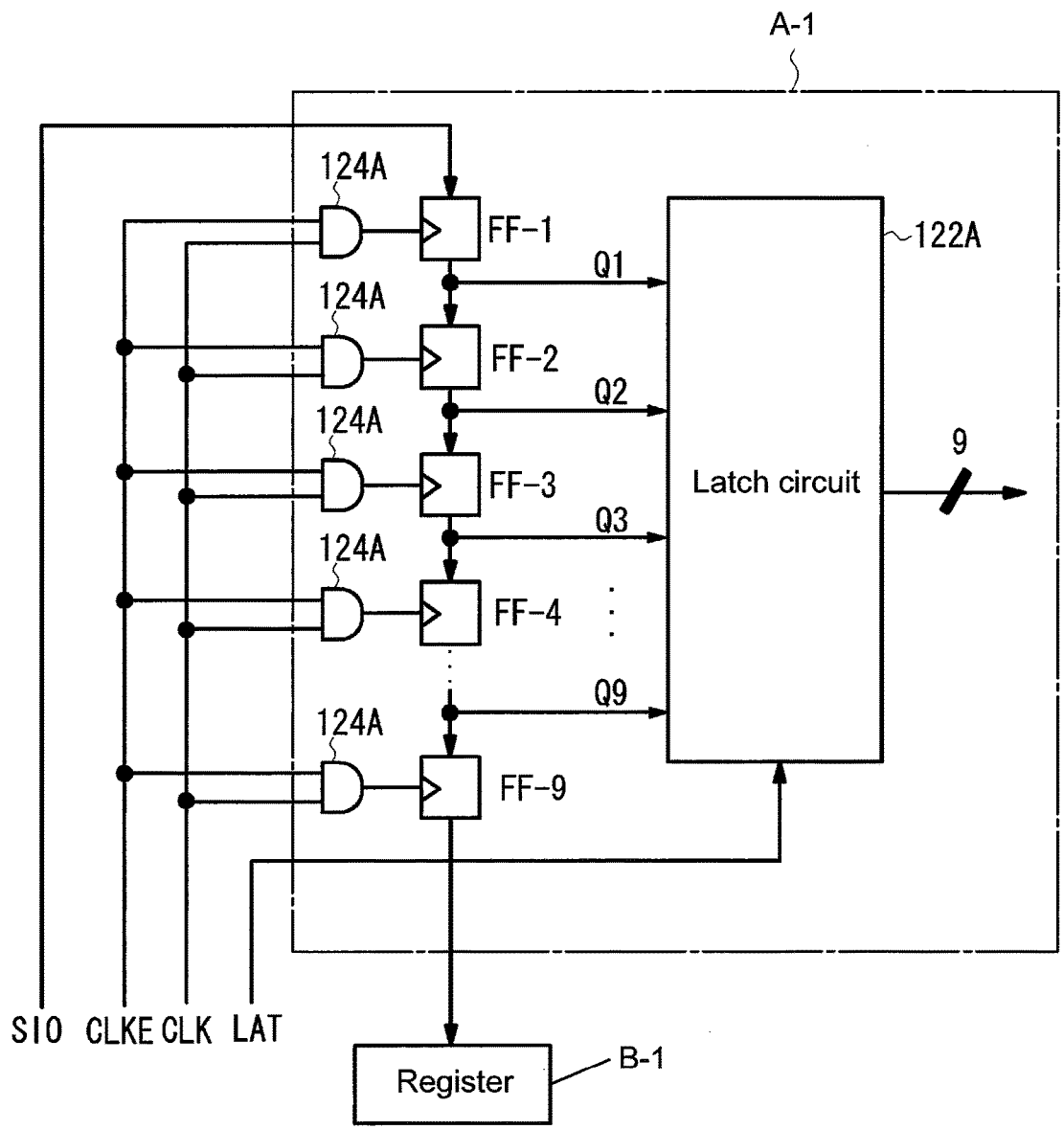
FIG. 5 illustrates an internal structure of a register A-1 of a second embodiment of the invention.

FIG. 5 illustrates a structure of the register A-1 of the second embodiment. In the second embodiment, besides the 3 signal lines of the first embodiment, the connecting element 130 further includes one signal line used for transmitting the clock enable signal CLKE. The clock enable signal CLKE and the clock signal CLK are commonly supplied to each of the registers A-1~13-1. The register A-1 includes 9 AND gates 124A used for inputting the clock signal CLK and the clock enable signal CLKE. An output of each of the AND gates 124A is connected to a clock input of the flip-flops FF-1~FF-9. The other registers B-1, C-1 and D-1 also include the AND gates corresponding to the number of the flip-flops.

Figure 6:
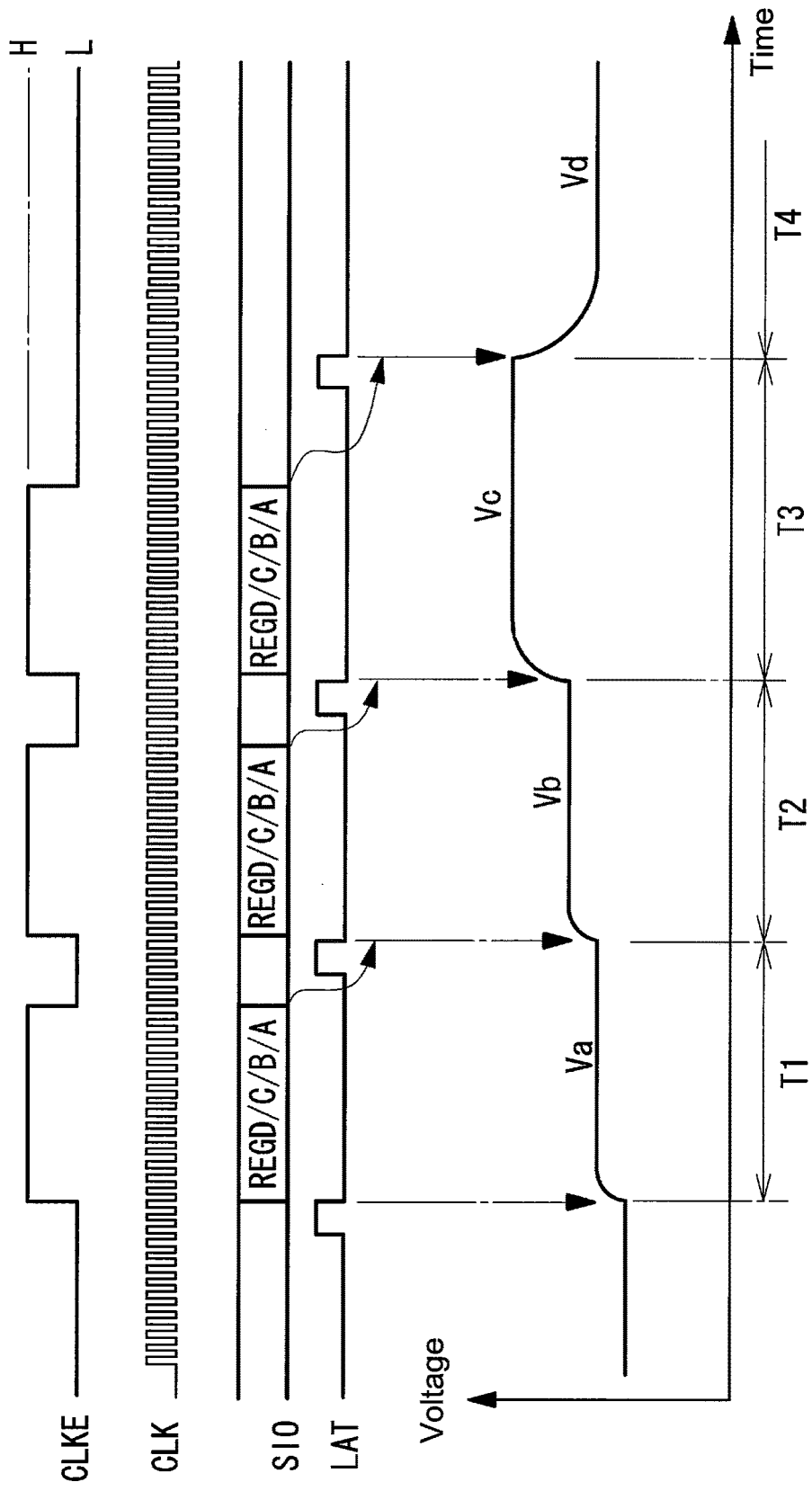
FIG. 6 is a timing diagram for operations of a voltage generation circuit of the second embodiment of the invention.

FIG. 6 is a timing diagram of a voltage generation circuit of the second embodiment. The control logic 110 outputs the clock enable signal CLKE of the H level when the serial data SIO of 22 bits is serially input to the registers A-1~D-1, such that the 22 clock signals CLK become effective in each of the registers A-1~D-1. In this way, during the period that the clock enable signal CLKE has the H level, the registers A-1~D-1 serve as a shift register.

Figure 7:
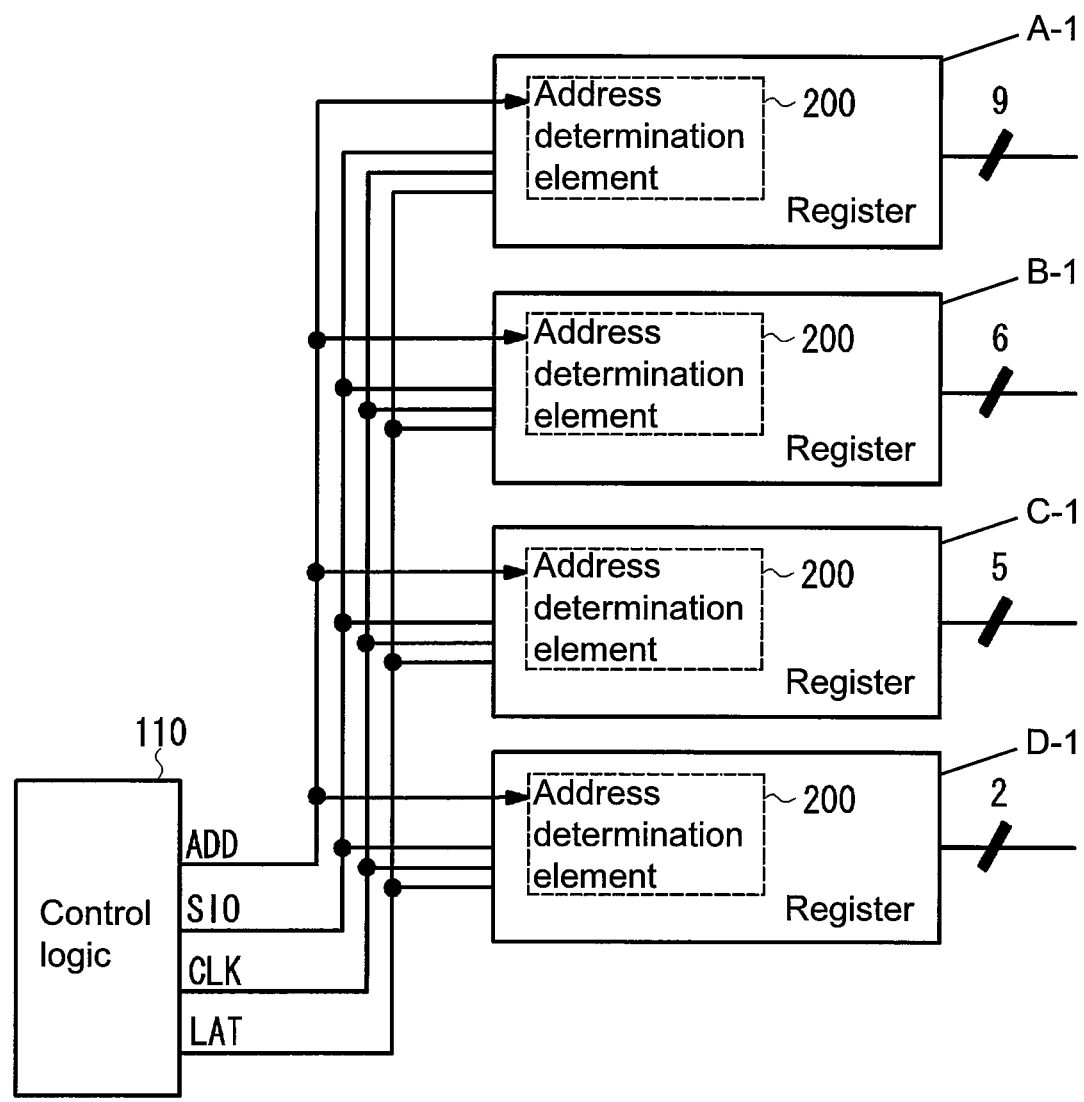
FIG. 7 is a structural block diagram of a voltage generation circuit according to a third embodiment of the invention.

Then, a third embodiment of the invention is described below. In the first embodiment and the second embodiment, by making all of the registers A-1~D-1 to operate, the serial data SIO of 22 bits is set to the registers A-1~D-1, though in the third embodiment, data entry can be performed to any register selected from the registers A-1~D-1. In the third embodiment, as shown in FIG. 7, besides the 3 signal lines of the first embodiment, the connecting element 130 further includes one signal line used for transmitting an address signal ADD. The address signal ADD is commonly supplied to each of the registers A-1~D-1.

The registers A-1~D-1 respectively have fixed identification information ID, and respectively determine whether the address signal ADD output by the control logic 110 is consistent with the identification information ID of itself, and in case of consistency, the serial input of the serial data SIO becomes possible. In a preferred example, the control logic 110 serially outputs the address signal ADD of 2 bits in order to select the four registers A-1~D-1. On the other hand, the registers A-1~D-1 respectively include an address determination element 200, and the address determination element 200 is used for determining whether the input address signal ADD of 2 bits is consistent with the identification information ID of itself.

Figure 8:
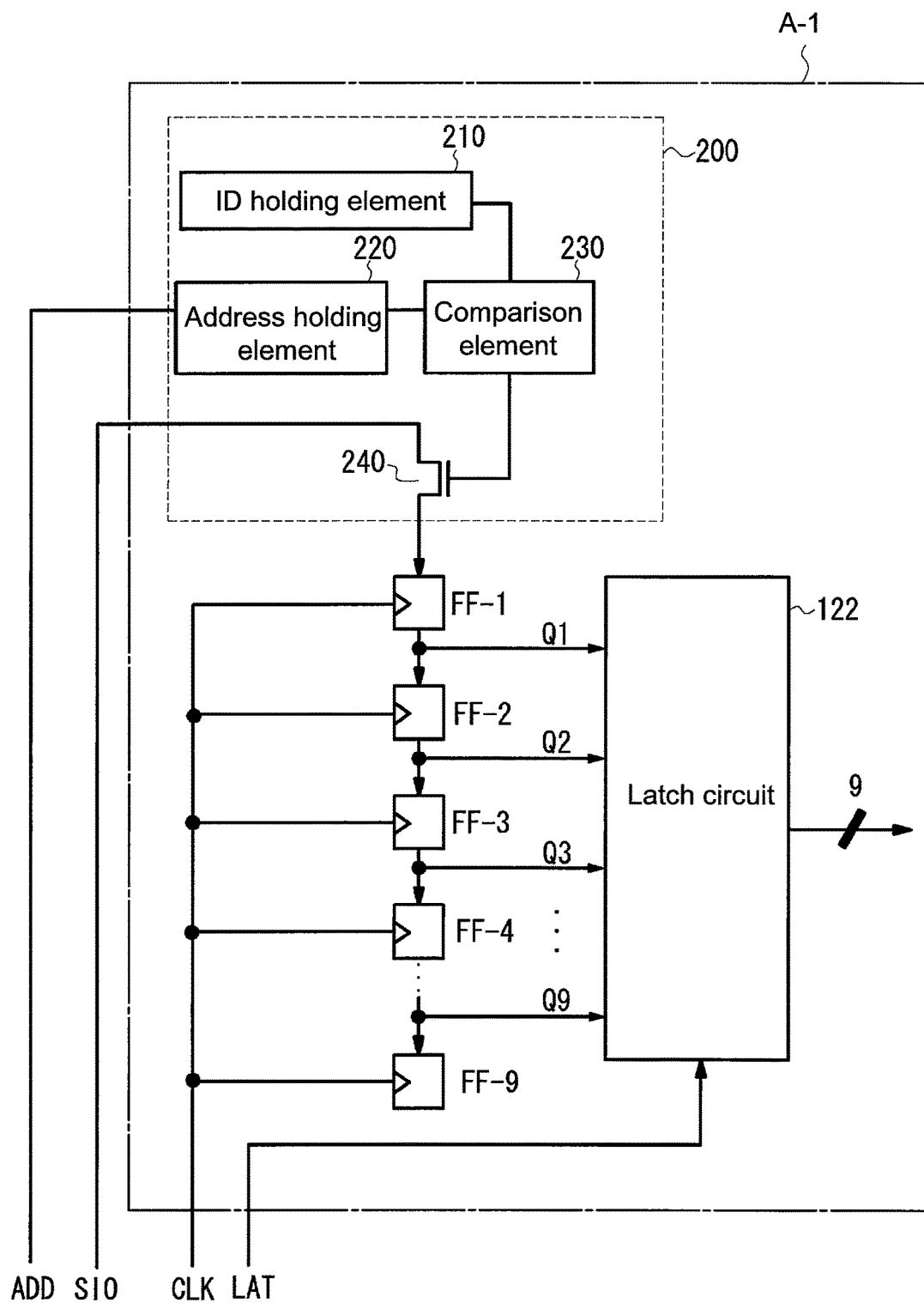
FIG. 8 illustrates an internal structure of the register A-1 of the third embodiment of the invention.

FIG. 8 illustrates a structure of the address determination element 200. The address determination element 200 includes an ID holding element 210, which holds the identification information ID of the register of itself; an address holding element 220, which holds the address signal ADD of 2 bits serially output from the control logic 110; a comparison element 230, which compares the identification information ID with the address information ADD; and a transistor 240, which is turned on/off based on the comparison result of the comparison element 230. The address holding element 220, for example, includes two flip-flops serially inputting the address signal ADD of 2 bits. The comparison element 230 outputs a signal of the H level to turn on the transistor 240 when the identification information ID is consistent with the address information ADD, and outputs a signal of an L level to turn off the transistor 240 in case of inconsistency. The transistor 240 is connected in series between the signal line used for transmitting the serial data SIO and the flip-flop FF-1 of the initial stage of the register A-1, and when the identification information ID is consistent with the address information ADD, the serial data SIO is input to the flip-flop FF-1. It should be noted that in the third embodiment, not all of the registers A-1, B-1, C-1 and D-1 are serially connected to operate as the shift register, but the registers A-1, B-1, C-1 and D-1 respectively operate as the shift register. Therefore, the output of the flip-flop FF-9 of the final stage of the register A is not connected to the input of the flip-flop FF-1 of the initial stage of the register B-1.

Figure 9:
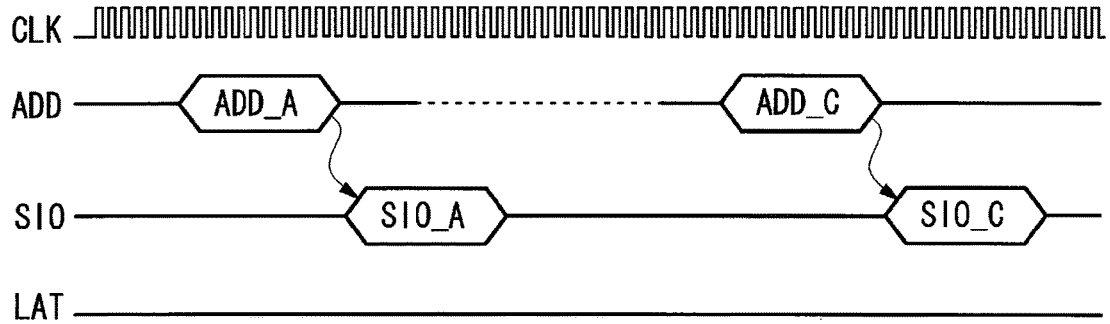
FIG. 9 is a timing diagram for operations of the voltage generation circuit of the third embodiment of the invention.
Figure 10:
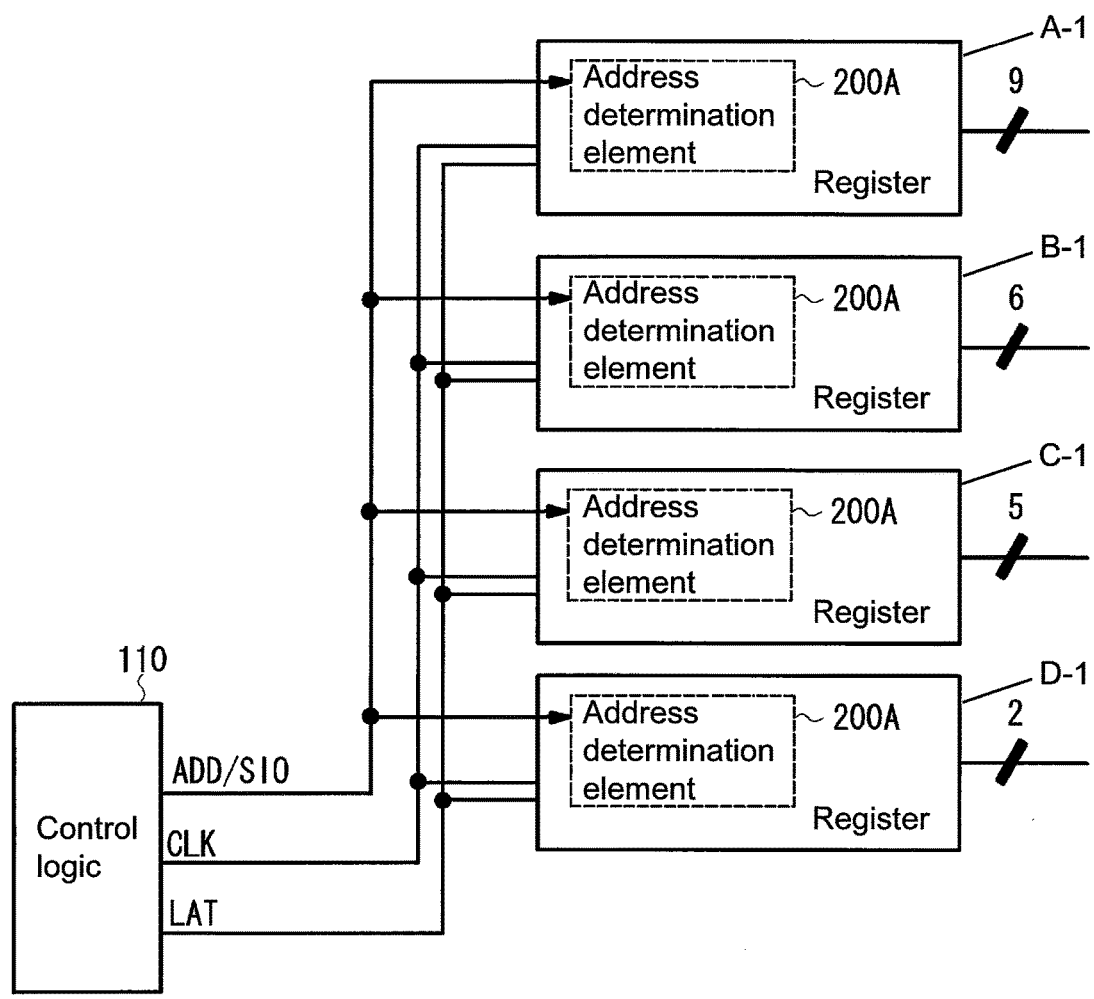
FIG. 10 illustrates a structure of a voltage generation circuit according to a fourth embodiment of the invention.

FIG. 9 is a timing diagram of the third embodiment. When the control logic 110 sets data to the register A-1, the control logic 110 sends the address signal ADD_A of the register A-1, and then sends the serial data SIO_A of 9 bits to be set to the register A-1. At this time, since the address signal ADD_A of the register A-1 is consistent with the identification information ID of itself, the transistor 240 is turned on through the comparison element 230, the serial data of 9 bits is synchronous to the clock signal CLK while the serial data of 9 bits is set to the flip-flops FF-1~FF-9. On the other hand, in the other registers B-1, C-1 and D-1, since the address signal ADD_A is not consistent with the identification information ID of itself, the transistor 240 is turned off through the comparison element 230, and data is not input to the flip-flops FF-1 of the initial stage of the registers B-1, C-1 and D-1. Moreover, in case that data is set to the register C-1 immediately after data setting of the register A-1, the control logic 110 sends the address signal ADD_C of the register C-1, and then sends the serial data SIO_C of 5 bits.

In this way, in the present embodiment, the register required to be updated can be selected, and data is serially input to the selected register for setting. Therefore, the time required for data setting of the register can be shortened, so as to cope with a high speed operation of the flash memory. Moreover, in the present embodiment, input of the serial data SIO is controlled by the transistor 240, though it is only an example, and the input of the serial data SIO can also be controlled by a logic including a NAND gate and an inverter instead of using the transistor 240, or the input of the serial data SIO can also be controlled by turning on/off a complementary metal-oxide-semiconductor transistor (CMOS) transfer gate according to a comparison result of the comparison element 230, the NAND gate inputs the serial data SIO and the comparison result of the comparison element 230, and the inverter is connected to an output of the NAND gate.

Then, a fourth embodiment of the invention is described. The fourth embodiment shares the signal line used for transmitting the address signal ADD and the signal line used for transmitting the serial data SIO in the third embodiment. Therefore, number of signal lines used for connecting the control logic 110 and the voltage generating element 120 is three.

Figure 11:
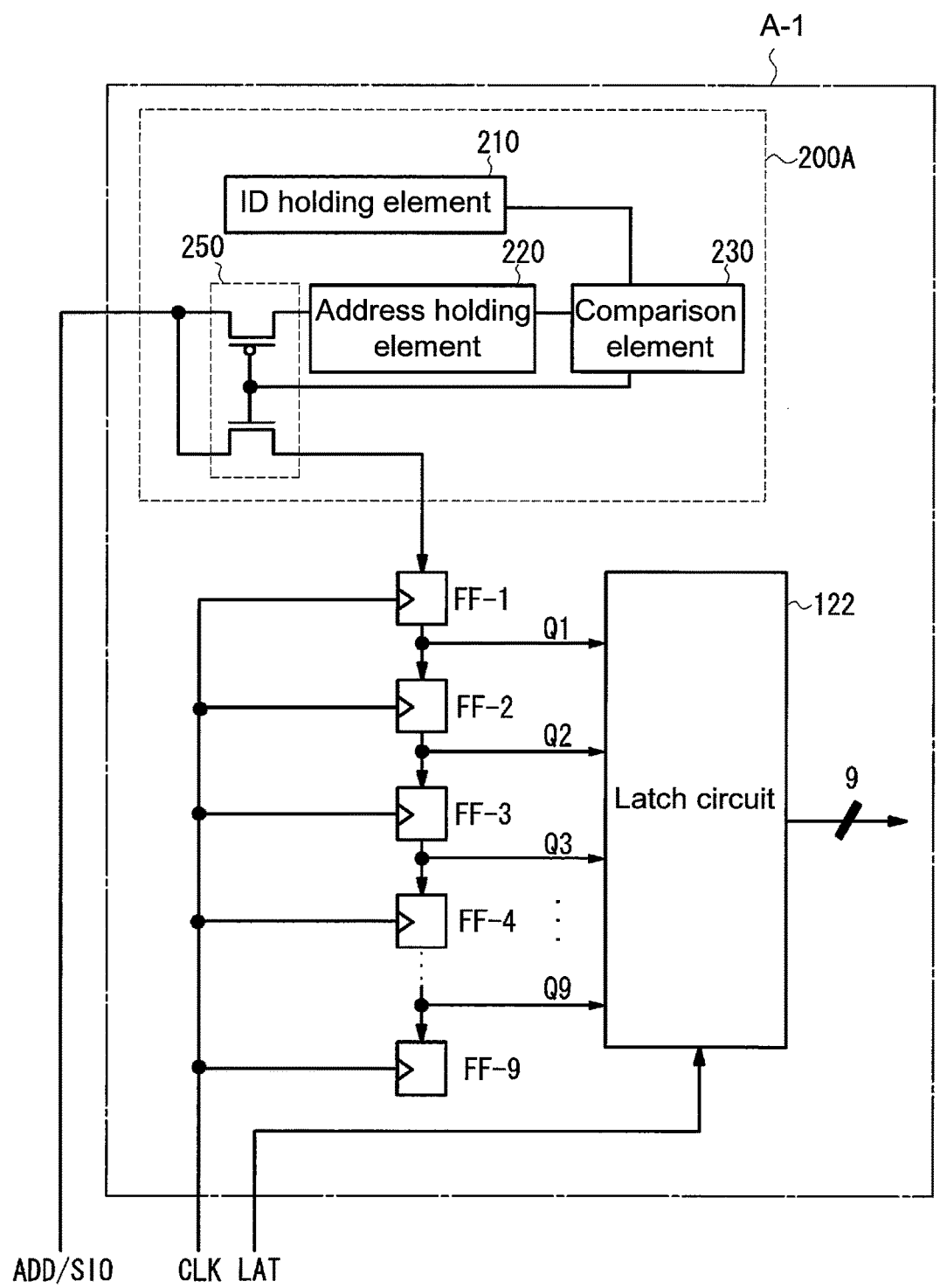
FIG. 11 illustrates an internal structure of the register A-1 of the fourth embodiment of the invention.

FIG. 11 illustrates an internal structure of the register A-1. Similar to the third embodiment, the address determination element 200A includes the ID holding element 210, the address holding element 220 and the comparison element 230. The determination element 200A further includes a pass gate 250, and the pass gate 250 includes a pair of PMOS and NMOS pass transistors controlled by the comparison element 230. The comparison element 230 in an initial state supplies the signal of the L level to the pass gate 250, and the PMOS transistor is in a turn-on state, and the NMOS transistor is in a non-turn-on state. When the control logic 110 outputs the address signal ADD, the address signal ADD is supplied to the address holding element 220, and it is determined whether the address signal ADD is consistent with the identification information ID of itself. In case of consistency, the comparison element 230 outputs a signal with a high level to the pass gate during a fixed period, and during such period, the PMOS transistor becomes the nonturn-on state, and the NMOS transistor becomes the turn-on state. During such period, the control logic 110 outputs the serial data of 9 bits, and the serial data of 9 bits is input to the flip-flop FF-1 through the pass gate 250. In case that the address signal ADD is not consistent with the identification information ID, the output of the comparison element 230 to the pass gate 250 is not changed, so that the serial data SIO is not input to the flip-flop FF-1.

Figure 12:
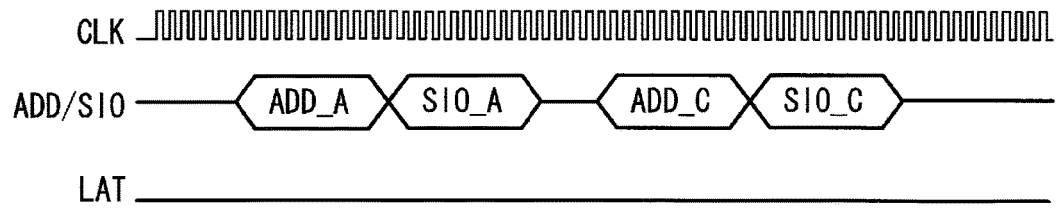
FIG. 12 is a timing diagram for operations of the voltage generation circuit of the fourth embodiment of the invention.

FIG. 12 is a timing diagram of the fourth embodiment. When the control logic 110 sets data to the register A-1, the control logic 110 sends the address signal ADD_A of the register A-1 through the single line, and then sends the serial data SIO_A of 9 bits to be set to the register A-1. At this time, since the address signal ADD_A of the register A-1 is consistent with the identification information ID of itself, input of the serial data to the flip-flop FF-1 can be performed through the pass gate 250. The serial data of 9 bits output by the control logic 110 is synchronous to the clock signal CLK while the serial data of 9 bits is set to the flip-flops FF-1~FF-9 and held thereto. On the other hand, in the other registers B-1, C-1 and D-1, since the address signal ADD_A is not consistent with the identification information ID of itself, the pass to the flip-flop FF-1 through the pass gate 250 is blocked, and data is not input to the registers B-1, C-1 and D-1. Moreover, in case that data is set to the register C-1 immediately after data setting of the register A-1, the control logic 110 sends the address signal ADD_C of the register C-1, and then sends the serial data SIO_C of 5 bits. In this way, according to the fourth embodiment, the number of the signal lines can be decreased compared with the third embodiment. Moreover, in the present embodiment, input of the serial data SIO is controlled by the pass gate 250, though it is only an example, and the input of the serial data SIO can also be controlled by a logic including a NAND gate and an inverter or a CMOS transfer gate as that described above instead of using the pass gate 250.

Then a fifth embodiment of the invention is described below. In the fourth embodiment, the address signal ADD and the serial data SIO share one signal line, so that a certain time is required for inputting the address signal ADD to inputting the serial data SIO. Therefore, the fifth embodiment is to parallelly output data to be set to the register.

Figure 13:
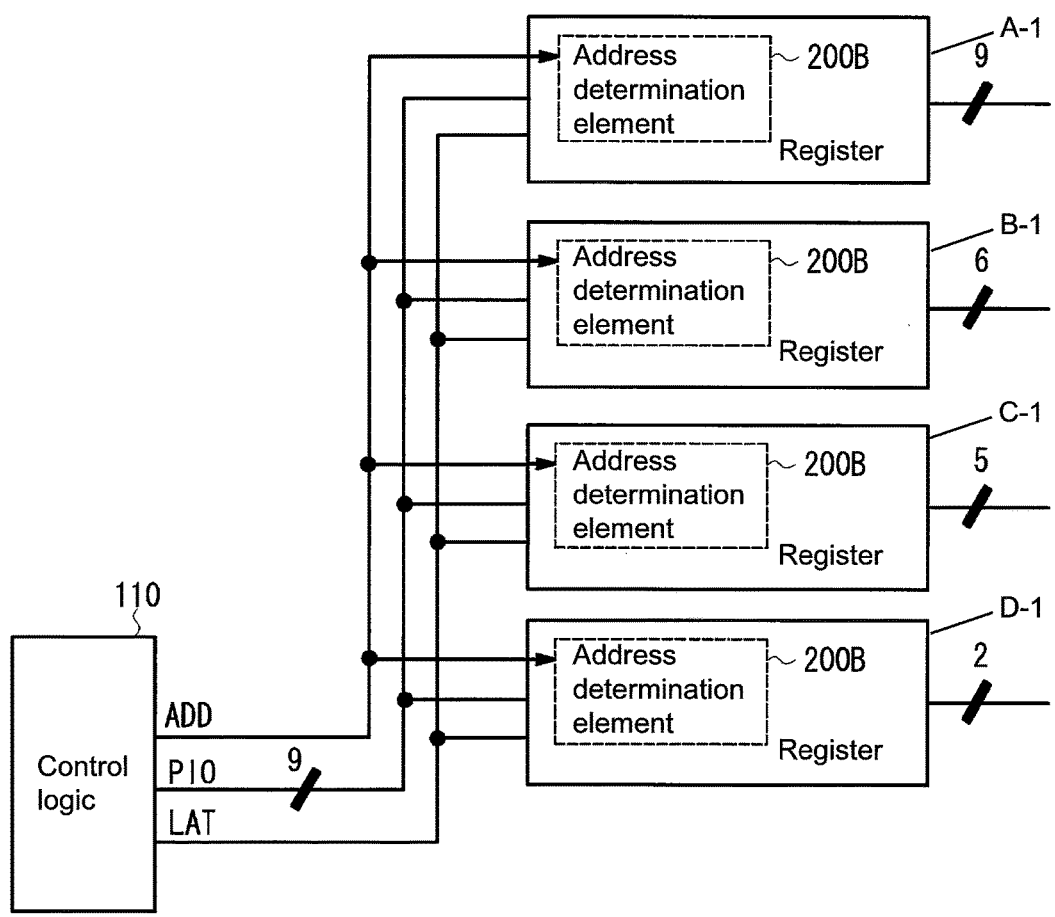
FIG. 13 illustrates a structure of a voltage generation circuit of a fifth embodiment of the invention.

FIG. 13 illustrates a structure of the fifth embodiment. In the fifth embodiment, the structure includes a signal line used for transmitting the address signal, a signal line used for transmitting control data, and a signal line used for parallelly transmitting data with a bit number that is the same to the maximum bit number of data held by one of the registers A-1~D-1. In the present embodiment, the register A-1 holds data of 9 bits, so that there is 9 signal lines.

Figure 14:
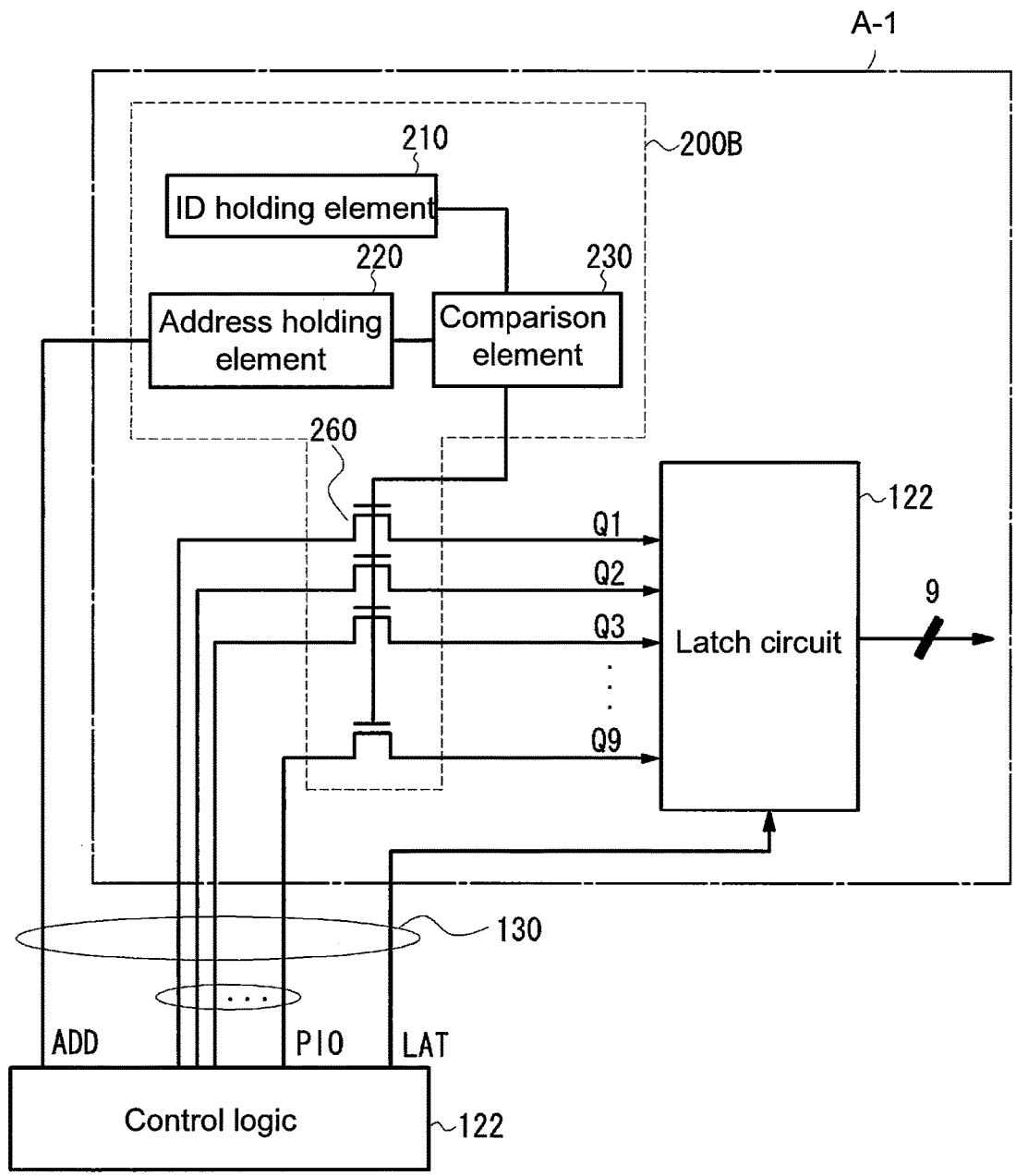
FIG. 14 illustrates an internal structure of the register A-1 of the fifth embodiment of the invention.

FIG. 14 illustrates an internal structure of the register A-1 of the present embodiment. Similar to the third embodiment and the fourth embodiment, the address determination element 200B includes the ID holding element 210, the address holding element 220 and the comparison element 230. In the present embodiment, the parallel data PIO of 9 bits can be input to the latch circuit 122 through a pass transistor 260. Namely, 9 pass transistors 260 are connected between 9 signal lines used for transmitting the parallel data and input terminals of the latch circuit 122, and gates of the 9 pass transistors are commonly connected to the output of the comparison element 230. The comparison element 230 outputs the H level to the gates of the pass transistors 260 when the address signal ADD is consistent with the identification information ID of itself, so as to set the pass transistors 260 to the turn-on state, and in case of inconsistency, the comparison element 230 outputs the L level to set the pass transistors 260 to the non-turn-on state. In this way, the parallel data can be set to the register selected according to the address signal ADD at one time. The registers B-1, C-1 and D-1 may have the same structure with that of the register A-1, and since the maximum number of the signal lines used for transmitting the parallel data is 9, which is not inadequate in the registers B-1, C-1 and D-1. For example, the register B-1 holds data of 6 bits, and 3 signals becomes redundant, and these signal lines are not connected to the register B-1.

Figure 15:
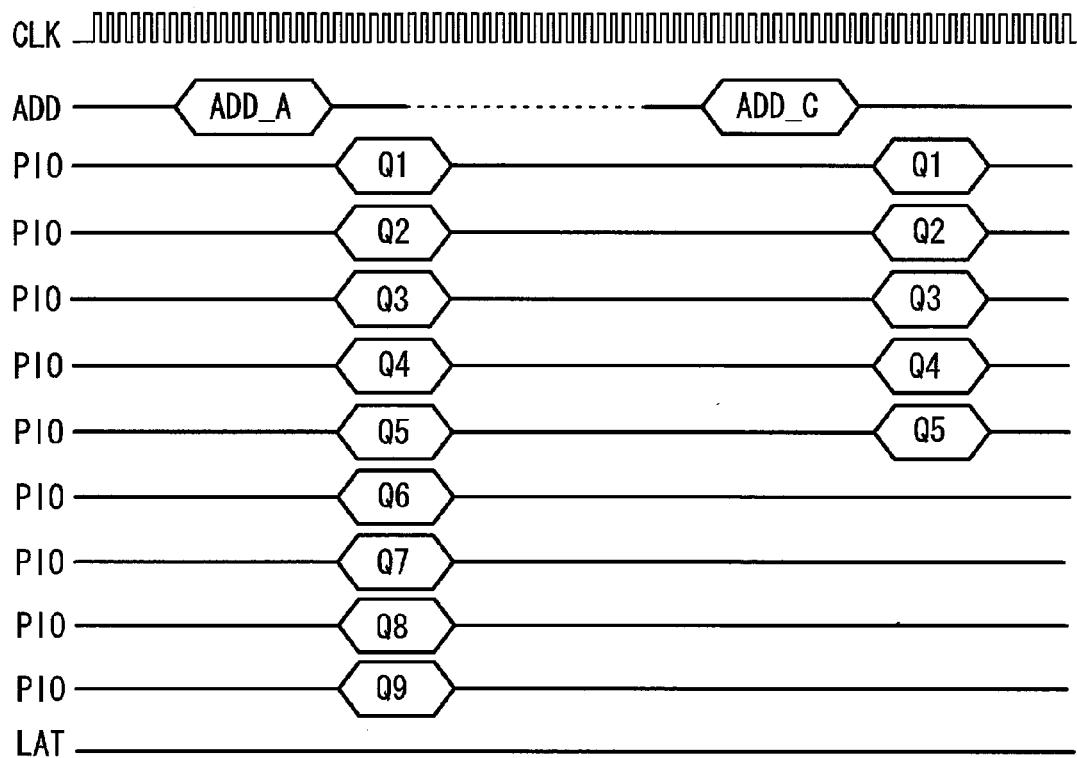
FIG. 15 is a timing diagram for operations of the voltage generation circuit of the fifth embodiment of the invention.

FIG. 15 is a timing diagram of the fifth embodiment. When the control logic 110 sets data to the register A-1, the control logic 110 outputs the address signal ADD_A, and then holds the parallel data of 9 bits to the latch circuit 122 through the 9 signal lines. Moreover, in case that data is set to the register C-1, the parallel data of 5 bits is held to the latch circuit 122 of the register C-1 through 5 signal lines.

According to the present embodiment, since the parallel data PIO is sent, data setting of the registers can be implemented in a high speed, so as to increase a voltage generation speed. Moreover, in the above embodiments, the pass transistors 260 are used to control input of the parallel data, though it is only an example, and the input of the parallel data can also be controlled by a logic including a NAND gate and an inverter or a CMOS transfer gate as that described above instead of using the pass transistors 260.

The aforementioned embodiments provide the voltage generation circuits, though the invention is not limited thereto, and the embodiments are also adapted to circuits for setting a plurality of levels or simulation. Moreover, the bit number of the serial data SIO in the voltage generation circuit is only an example, and other bit number can also be adopted. Accordingly, a plurality of registers is adopted in the voltage generation circuit, though the invention is not limited thereto, and the number of the register can also be one.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A semiconductor device, comprising:
a first circuit, serially outputting a clock signal and data;
a second circuit, serially inputting the data according to the clock signal output by the first circuit, and comprising a holding element and a generating element, wherein the holding element holds the input data, and the generating element generates an output based on data parallelly output by the holding element; and
a connecting element, electrically connecting the first circuit and the second circuit, and comprising a first signal line and a second signal line, wherein the first signal line transmits the clock signal output by the first circuit, and the second signal line transmits the data output by the first circuit,
wherein when operation of the semiconductor device is ended, the first circuit serially outputs data of an initial value, and the second circuit holds the serially input data of the initial value.
2. The semiconductor device as claimed in claim 1, wherein the data output by the first circuit comprises gradation data of n bits, and the generating element generates a level output corresponding to the gradation data.

3. The semiconductor device as claimed in claim 1, wherein
the first circuit outputs control data, and the control data controls parallel output of the data held by the holding element,
the connecting element comprises a third signal line used for transmitting the control data,
the holding element parallelly outputs the held data to the generating element in response to the control data.

4. The semiconductor device as claimed in claim 1, wherein the first circuit serially outputs secondary data to the holding element during a period when the generating element generates the output.

5. The semiconductor device as claimed in claim 4, wherein when the semiconductor device executes a series of operations, the first circuit outputs data respectively corresponding to the series of operations.

6. The semiconductor device as claimed in claim 1, wherein
the first circuit outputs a clock enable signal,
the connecting element comprises a fourth signal line used for transmitting the clock enable signal,
the holding element serially inputs the data serially output by the first circuit in response to the clock enable signal.

7. The semiconductor device as claimed in claim 1, wherein
the first circuit outputs an address signal, wherein the address signal is used for selecting any one of a plurality of the holding elements,
the holding elements are respectively selected according to the address signal, and the holding element selected according to the address signal serially inputs the data output by the first circuit.

8. The semiconductor device as claimed in claim 7, wherein the address signal is commonly input to a plurality of the holding elements, and the holding elements respectively comprise a determination element, and the determination element determines whether the corresponding holding element is selected according to the address signal.

9. The semiconductor device as claimed in claim 7, wherein the connecting element comprise a fifth signal line used for transmitting the address signal.

10. The semiconductor device as claimed in claim 7, wherein the address signal is transmitted by the second signal line.

11. A semiconductor device, comprising:
a first circuit, parallelly outputting an address signal and data of n bits;
a second circuit, comprising a plurality of holding elements and a generating element, wherein the generating element generates an output based on data held by the holding elements; and
a connecting element, electrically connecting the first circuit and the second circuit, and comprising a signal line used for transmitting the address signal and n signal lines parallelly transmitting the data of n bits,
wherein the holding elements are respectively selected according to the address signal, and the selected holding element signal parallelly inputs the data output by the first circuit,
wherein the holding elements respectively comprise a determination circuit, and the determination circuit determines whether the corresponding holding element is selected according to the address signal,
wherein the first circuit and the second circuit are formed in a flash memory, the first circuit calculates voltages required by a read, program or erase operation, and the second circuit generates the voltages according to calculated data.

12. The semiconductor device as claimed in claim 11, wherein
the data output by the first circuit comprises selection data, and the selection data is used for selecting a plurality of outputs generated by the generating element, the selection data is transmitted to the holding element,
the second circuit comprise a selecting element, and the selecting element selects any one of the plurality of outputs generated by the generating element based on the selection data output by the holding element.

13. The semiconductor device as claimed in claim 11, wherein the first circuit calculates voltages required by operations of the semiconductor device, and outputs data according to calculation results, and the second circuit generate voltages according to the data input to the second circuit.

* * * * *